(12) United States Patent
Zhuge

(10) Patent No.: US 12,483,216 B2
(45) Date of Patent: Nov. 25, 2025

(54) DATA RECORDING BASED ON DUAL ADC ARCHITECTURE

(71) Applicant: Crystal Instruments Corporation, Santa Clara, CA (US)

(72) Inventor: James Q. Zhuge, Palo Alto, CA (US)

(73) Assignee: Crystal Instruments Corporation, Santa Clara, CA (US)

( * ) Notice: Subject to any disclaimer, the term of this patent is extended or adjusted under 35 U.S.C. 154(b) by 478 days.

(21) Appl. No.: 18/098,551

(22) Filed: Jan. 18, 2023

(65) Prior Publication Data

US 2024/0039497 A1 Feb. 1, 2024

Related U.S. Application Data

(60) Provisional application No. 63/392,842, filed on Jul. 27, 2022.

(51) Int. Cl.
*H04L 27/08* (2006.01)
*H03G 3/30* (2006.01)

(52) U.S. Cl.
CPC ......... *H03G 3/30* (2013.01); *H03G 2201/103* (2013.01)

(58) Field of Classification Search
CPC ...... H03G 3/30; H03G 2201/103; H03M 1/68
USPC ........................ 375/345, 316, 317
See application file for complete search history.

(56) References Cited

U.S. PATENT DOCUMENTS

| | | | |
|---|---|---|---|
| 5,001,440 A | 3/1991 | Zerod | |
| 5,838,733 A | 11/1998 | Bruckert | |
| 7,489,790 B2 | 2/2009 | Kindred et al. | |
| 8,036,402 B2 | 10/2011 | Furge | |
| 8,045,659 B2 | 10/2011 | Michael | |
| 8,204,258 B2 | 6/2012 | Craig et al. | |
| 9,325,286 B1 | 4/2016 | Yang | |
| 9,871,530 B1 * | 1/2018 | La Grou | H03M 1/68 |
| 10,079,578 B2 | 9/2018 | Qian et al. | |
| 2007/0273446 A1 | 11/2007 | Kim et al. | |
| 2011/0002467 A1 | 1/2011 | Nielsen | |

* cited by examiner

*Primary Examiner* — Phuong Phu
(74) *Attorney, Agent, or Firm* — Mark Protsik; Thomas Schneck

(57) ABSTRACT

A measurement system has a data acquisition architecture in one or more channels with storage in multiple sensor ranges. At least one sensor channel provides an analog measurement input signal, which is split into first and second amplifier-ADC paths, where a first path has relatively higher gain and smaller range than a second path. The digitized data is subject to cross-channel calibration that can serve as a trigger for the transfer of the two data streams into nonvolatile memory. The incoming data are temporarily stored for a specified period in a circular buffer, so that the trigger can also facilitate transfer of pre-trigger data from the buffer into the memory. A processor determines the presence or absence of any clipping of the higher-gain/smaller-range data and selects analysis of that smaller range data if no clipping is detected, but of the larger range data if clipping is detected.

16 Claims, 5 Drawing Sheets

DATA RECORDING BASED ON DUAL ADC ARCHITECTURE

CROSS-REFERENCE TO RELATED APPLICATION

This application claims priority under 35 U.S.C. 119(e) from U.S. provisional application 63/392,842, filed Jul. 27, 2022.

TECHNICAL FIELD

The present invention relates to amplifiers with gain control, or selection among multiple amplified channels, with attention paid to the presence of any clipping or distortion.

BACKGROUND ART

Automatic gain control (AGC) circuitry for use with amplifiers is well known as such. Additionally, the splitting of a signal into multiple frequency bands or channels is known. Differences reside in how the gain is controlled, adjusted, or selected, and in the basis for deciding the appropriate gain level. What happens to the several split channels also differs. In some cases, each distinct channel is given its own specific amplification gain before being combined again into a composite signal.

For example, in U.S. Pat. No. 5,001,440, Zerod controls gain of a pre-amplifier using a clipping level detector circuit to detect onset of clipping. In U.S. Pat. No. 5,838,733, Bruckert mitigates output signal distortion by an RF transmitter using a clipping and/or automatic gain control based upon signal waveform power or some other parameter to ensure that amplification for each channel remains within a linear range of the amplifiers. In U.S. Pat. No. 7,489,790 to Kindred et al., a processor of a digital audio signal (e.g., for a hearing aid) includes a pre-amplifier, an 'adjuster' to adjust the amplifier gain, and an 'inhibitor' to smooth the signal envelope and inhibit modulation. Amplifier gain is adjusted based upon whether the envelope exceeds a threshold. In U.S. Pat. No. 8,036,402, Furge describes distortion compensation of amplifiers in an automotive audio system that controls gain for a plurality of linked channels (e.g., channels A and B). The amplifier gain is adjusted according to whether an output exceeds a clipping threshold, that in turn is adjustable according to the battery supply voltage for the amplifiers. In U.S. Pat. No. 8,045,659, Michael describes an automatic gain control circuit for a receiver amplifier having a clip detector and accumulator that counts the number of transient clips at an intermediate frequency of the received signal, and then adjusts the gain according to whether the detected number of clips exceeds a threshold value. There can also be a second accumulator that judges a non-clip threshold value to increase the target value of the gain if clipping is too infrequent. In U.S. Pat. No. 8,204,258 to Craig et al., an audio system with an automatic level controller divides the amplifier output into a plurality of filtered signals of different frequency bands. A multiband dynamic controller then separately applies gain adjust signals to each band and generates a combined output. A pullback module provides feedback to reduce the gain if at least one of the gain adjust signals exceeds a threshold. In U.S. Pat. No. 9,325,286, Yang describes an audio processing device that prevents clipping by determining maximum stereo (left and right) amplitude values, and then attenuating the gain using a lookup table indexed to the amount by which these amplitudes exceed a threshold. In U.S. Pat. No. 10,079,578 to Qian et al., an audio amplifier system uses feedback from a clip detector as an attenuator input for gain control. A low total harmonic distortion is a result of the limiting the maximum power output from the amplifier system and the prevention of clipping. U.S. Patent Application Publication 2007/0273446 of Kim et al. shows an automatic gain control circuit for an audio amplifier that minimizes distortion caused by clipping. It does this by comparing amplifier output to a reference voltage and then automatically adjusting the gain (via a variable resistor) according to the comparison result, e.g., attenuating the gain if the output exceeds the reference voltage. U.S. Patent Application Publication 2011/0002467 of Nielsen describes 'dynamic enhancement' of audio signals by splitting the signal into two parts corresponding to different frequency bands, calculating rates of up/down adjustment of an enhancement gain value based on the size of available dynamic 'headroom' in the first (lower frequency) signal part at the previous gain level, applying the new gain to the first signal part, and combining the first signal part with the second signal part. Essentially, gain is adjusted only on the lower frequency portion of the signal then recombined with the higher frequency portion.

In U.S. Pat. No. 7,302,354, the present inventor described a cross-calibration method with a unique dual analog-to-digital (ADC) structure for data acquisition applications. In the disclosed data acquisition architecture 10, an analog input signal 12 is split into two pathways 14 and 16. Signals in the first pathway 14 pass through a small gain (e.g., gain=1) analog amplifier 18 before being converted into digital data by a first analog-to-digital converter (A/D A) 20. Signals in the second pathway 16 pass through a large gain (e.g., gain=1024) analog amplifier 22 before being converted into digital data by a second analog-to-digital converter (A/D B) 24. The amplified and digitized data from both pathways 14 and 16 are then calibrated and restitched together by a digital signal processor 26 in accord with the method described in U.S. Pat. No. 7,302,354, merging bits that are useful from each stream based on magnitudes of the calibrated data values and discarding any data from the large gain pathway 16 whenever that data is saturated at a specified range.

The technology described in this patent is very successful, with thousands of instruments that utilize this technology being shipped annually. The dual ADC structure and its associated cross-calibration method is very convenient with data acquisition instruments that acquire physical data, such as shock, vibration, strain, or acoustic signals, because users do not need to set the input range of the instrument, even when the range of signal values cannot be known in advance.

In the more than 15 years of usage of '354 patent technology, we found that best results are achieved when the input signals are relatively stable over a certain period, with changes to another level occurring only gradually. For example, in machine condition monitoring, vibration signals are commonly used for fault diagnosis. The vibration signals often are at small level, which indicates no fault, and after a few weeks or months, they gradually may go to a higher level, indicating the presence of some kind of fault. Usually, the machine vibration does not jump from small to a high level in milliseconds. Instead, amplitude changes take longer than seconds.

Another successful application of the '354 patent technology is for environmental vibration control. Random or Sine type of signals can be used as excitation. The vibration level changes from time to time. The users often care about the testing behavior at a certain vibration level.

In all these use cases, the dual ADC structure and associated calibration process can be successfully applied. The "stitching" method of combining the data from two ADCs into one channel is very successful and widely accepted in this industry. The basic data flow of the invention in that patent is depicted in FIG. 1.

However, in more than 15 years of use of this technology, we also identified that in certain areas there is potential room of improvement. One of the cases is when the user really cares about the transient process when the input signals go from small to large, or from large to small. The transient duration is on magnitudes of seconds or less. In such a transient process, because the "stitching" method may introduce certain artificial changes to the signals, users sometime have difficulty in accepting the stitched signals. This is because the stitching process could introduce artifacts into the merged data that is not present in either stream.

SUMMARY DISCLOSURE

A dual ADC architecture is provided that chooses between two data channels, one with small gain amplification and another with large gain amplification, based on the existence of clipping of data, which is determined from whether total harmonic distortion (THD) of the large gain signal exceeds a threshold value. If there is clipping distortion in the large gain signal, then the small gain signal is chosen. If there is no clipping, then the large gain signal can be chosen, because it has a better signal-to-noise ratio.

Although data acquisition systems equipped with multiple input channels, each with its own input range setting, are known, the method proposed here is different from such conventional multi-channel recorders in several aspects:

1. The cross-channel calibration process is unique. In all other data acquisition systems, the calibration is conducted to compare any input channel to a standard source, and each individual input channel's error is adjusted. In our design, the cross-channel calibration is conducted between two ADC channels so they will match to the highest precision. The purpose of cross-channel calibration is different to a conventional calibration.
2. In an instrument that is implemented with this technology, each of input channels can with switched to so called the Auto mode, which use the stitching method described in the aforementioned '354 patent, or so-called Dual mode, which is described in this disclosure. The user can select one of these modes based on his application and type of the signals to be recorded. The other DAQ systems do not have these choices.
3. With conventional instrument with multiple input channels that do not use the dual ADC structure on each input channel, twice the number of sensors will need to be used, because each input channel must be connected to one sensor. The method proposed here uses only half the number.

Benefits of the proposed method that records the data from both small and large ADC ranges include:

1. This method maintains the advantage of dual ADC structure, which eliminate the human involvement of range settings to the amplifiers. The convenience of operation is maintained.
2. The method maintains the advantage of generates high dynamic range results at the end of signal processing. The application software will determine if the data from large or small ADC range will be used based on the clipping status of small range ADC channel. The goal is to process the data with the best signal-noise-ratio given a real time detection.
3. This method does not introduce artifacts of the stitching process because it does not merge the data from two ADCs together into one stream.
4. This method is very much adequate to handle the transient process of dynamic signals.

DETAILED DESCRIPTION

Figure 1:
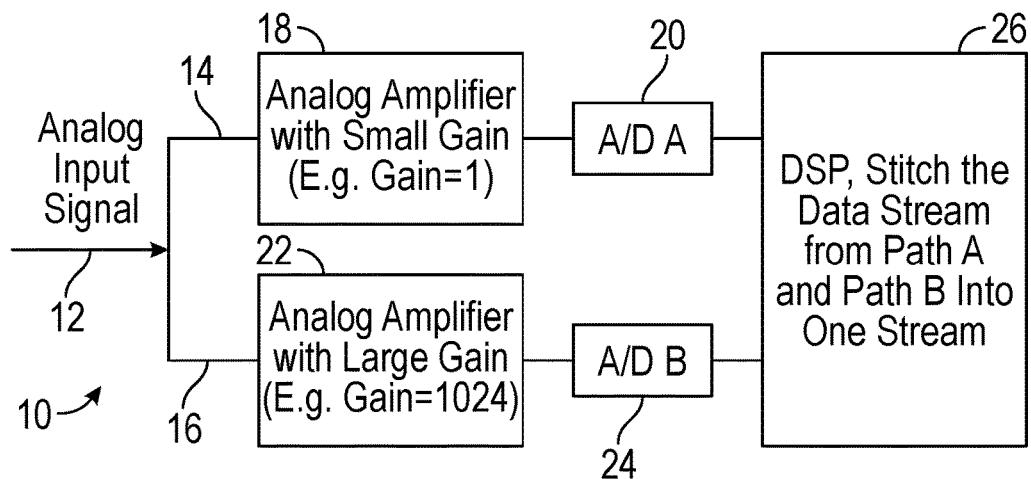
FIG. 1 is a schematic block diagram of a prior art data acquisition architecture using the stitching technology of U.S. Pat. No. 7,302,354 for digitized signal recording of a combined data stream.
Figure 2:
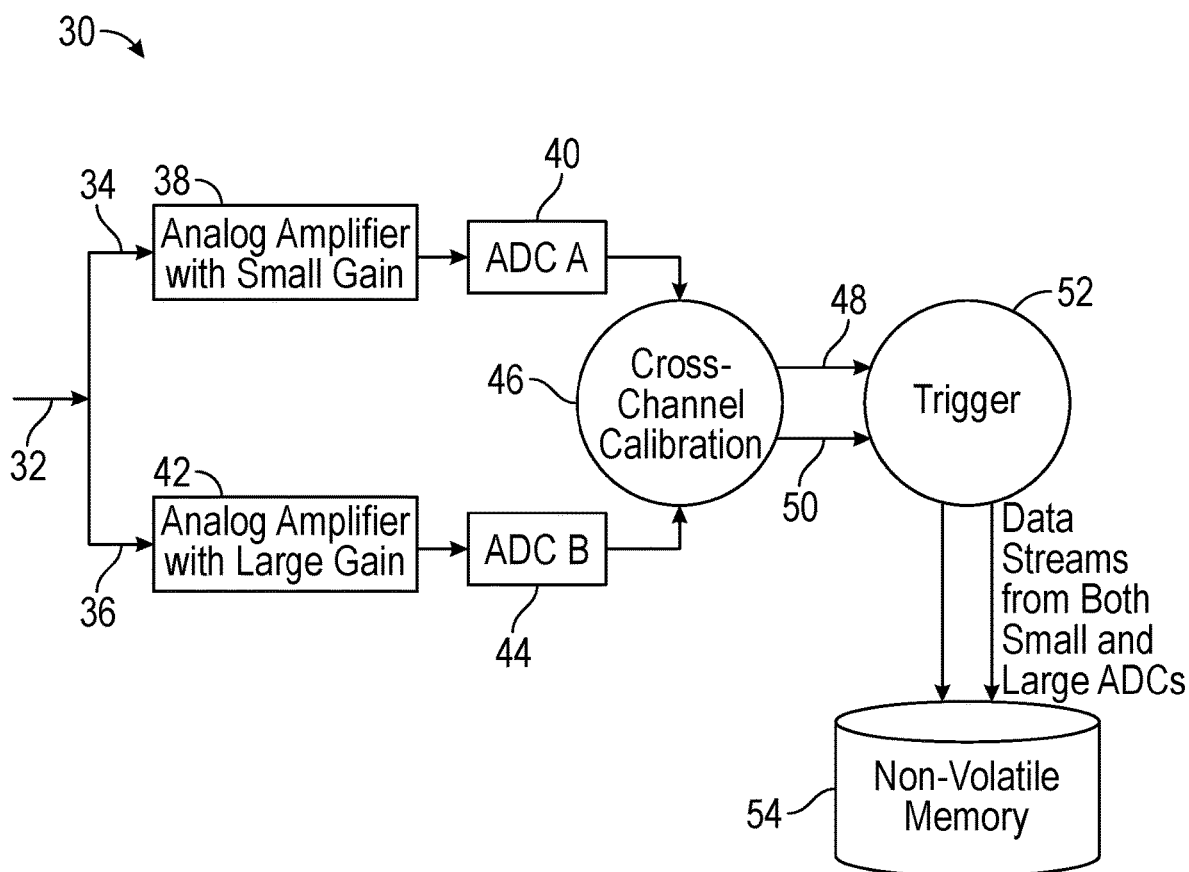
FIG. 2 is a schematic block diagram of a data acquisition architecture of the present invention saving separate data streams from both small and large gain signal pathways.

This disclosure describes a way of handling the transient type of signals under the dual ADC structure. The data flow of the improved structure is shown in FIG. 2. A data acquisition architecture 30, an analog input signal is received from a sensor channel 32. (A unit may include multiple sensor channels, each of which having the same structure as described for this channel.) The input channel 32 is split into two (or more) pathways 34 and 36 with different amplifier gains. Signals in the first pathway 34 pass through a relatively small gain (e.g., gain=1) analog amplifier 38 before being converted into digital data by a first analog-to-digital converter (ADC A) 40. Signals in the second pathway 36 pass through a relatively larger gain (e.g., gain=1024) analog amplifier 42 before being converted into digital data by a second analog-to-digital converter (ADC B) 44. The relative gains of the respective amplifiers in the first and second paths typically differ at least 10-fold, and then the corresponding ranges of the respective digital data streams in the second and first paths also typically differ at least 10-fold. To this point, the architecture is substantially like that in U.S. Pat. No. 7,302,354, but now there will be no stitching of the two data streams.

The amplified and digitized data from both pathways 34 and 36 then undergo cross-channel calibration 46 but are retained as separate buffered amplified digital data streams 48 and 50. The cross-channel calibration is conducted between the two ADC pathways themselves (not to some standard source) so that they will match to the highest precision. The calibrated data streams 48 and 50 pass through a trigger detector 52 (the operation of which will be described in more detail below with reference to FIG. 3), and if a trigger event occurs, buffered data from both streams will be saved to a nonvolatile memory unit 54 for later analysis.

Thanks to the progress in the electronics hardware, the storage of data is getting much cheaper. The speed of the processor is also getting much faster. The solution to handle the transient process is that after the cross-channel calibration described in this inventor's aforementioned '354 patent, the two streams of data from two ADCs are not stitched together. Instead, both data streams are stored into volatile or non-volatile memory 54. Volatile memory is a type of memory that maintains its data only while the device is powered. A non-volatile memory is a type of memory will keep the data even when power is shutdown. SD card is a typical non-volatile memory.

Thus, in a 'dual mode', two ADC channels 48 and one with high amplifier gain and small ADC range, and another with low amplifier gain and large ADC range, are simultaneously recorded. (Note that when we refer to a low or small range ADC, it has larger gain in its amplifier 42. A large range ADC path has smaller gain in its amplifier 38. Also, the terms low and high gain, as well as small and large range, are relative to each other and not to any specific absolute value. That is, the "low gain" amplifier 38 has lower gain than the "high gain" amplifier 42, and similarly with the high and low ADC ranges.) Which of the stored ADC data channels 48 and 50 to use for analysis is determined later. This at least doubles the amount of memory hardware 54 that is needed.

Usually, there is a trigger operation in the data acquisition process, e.g., whenever an incoming sensor signal crosses a specified threshold level. Trigger events are defined as user-configurable conditions, based on several types of inputs fed from various trigger sources received by the recording hardware unit, that provide for some configurable system response. A wide range of available trigger events and system actions allow users to configure the execution of desired functions days or weeks in advance when the unit is left unattended.

Trigger sources that generate trigger events can be one of many types and can go beyond sensor input amplitudes above some trigger threshold level. For example, the trigger sources may include, but are not limited to: (1) automatic dependent surveillance-broadcast (ADS-B) messages from aircraft operating in controlled airspace, e.g., to initiate noise monitoring in nearby ground recording units; (2) satellite communication messages; (3) fourth-generation (4G) long-term evolution (LTE) wireless broadcast cellular network messages from various mobile telephones or telecommunication devices; (4) manual triggers using hardware buttons on the data acquisition unit; (5) analog input triggers (such as sensor signals of the unit) or as part of a data conditioning phase of the unit; (6) an absolute time (UTC)-based trigger as part of a data conditioning phase of the unit; (7) a real-time clock (RTC) based trigger; (8) digital input triggers; (9) frequency domain threshold triggers as part of a signal analyzer phase of the unit; (10) a pre-defined system configuration run schedule, e.g., upon a unit's power up or reset; and (11) user commands from host software. Other trigger sources are possible. The analog input trigger (5) and UTC time trigger (6) are precision triggers based on detection per sampling point. The frequency domain threshold trigger (9) is generated by the unit's signal analyzer, which could have a latency duration of up to 1 block. Other trigger sources are based on external sources. External source triggers have certain latency times on the order of milliseconds. For example, a manual trigger will take a fraction of a second for the unit's processor to respond when a user presses a hardware button on the unit.

Possible system actions in response to a specific trigger event are varied and can go beyond simply recording a sensor input signal. For example, they might include initiating or switching of a configuration, the initiating of one or more self-tests, setting to sleep or hibernate, as well as auto-power ON or wake up, the start and stop of recording, and the enabling or disabling of a source output.

Figure 3:
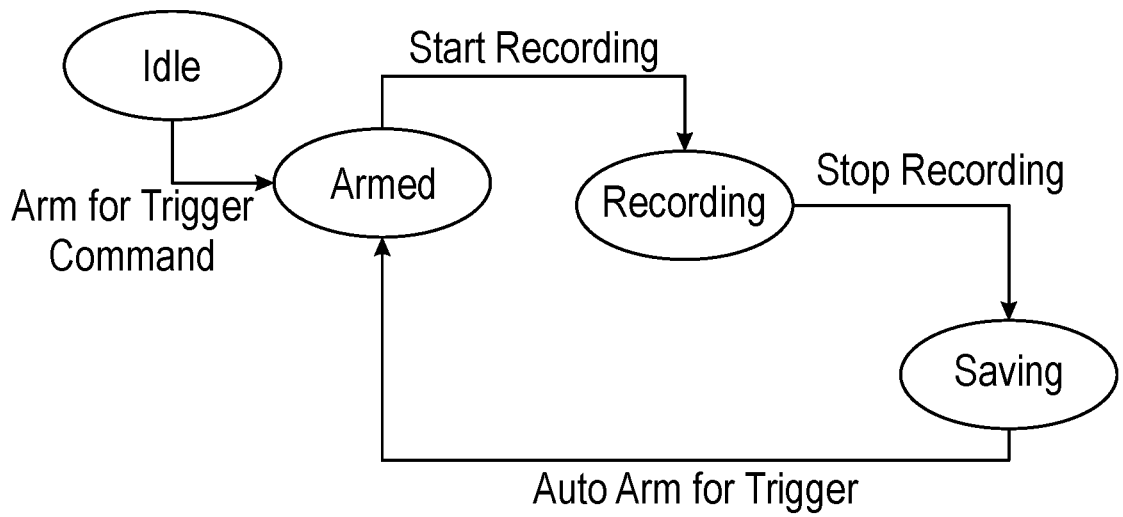
FIG. 3 is an example of one possible state diagram for the architecture of FIG. 2.

There are numerous operating states of the data acquisition unit in addition to armed and recording states (such as idle during setup and self-test, or saving to an output data card, or a recorded data transmission state to an external unit). FIG. 3 shows one representative state diagram for a data acquisition unit in accord with the present invention.

During setup, the unit is in an Idle state. In this state the unit is not acquiring data. However, the unit is still actively looking for external sources of trigger. The corresponding action is executed when an external source of trigger is received.

In most typical operations, the unit will enter an Armed for Trigger or simply Armed state. In this state, the unit is actively recording to the circular buffer (discussed later with reference to FIG. 4), while monitoring the trigger events from all possible sources of trigger.

Whenever a trigger event is received and when the event is to Start Recording, the unit stops recording to the pre-trigger buffer and starts time stream recording to an SD memory card. This state is called Recording. The recording continues until the recording time set by the user expires or when a Stop Recording command is received. In this state, any further Start Recording commands are ignored. In the recording state, the pre-trigger buffer is also copied over to the SD card in order to combine the pre-trigger and post-trigger recordings.

When a Stop Recording command is received or when the recording time is reached and if the pre-trigger is not completely copied over to the SD card, the unit will enter the Saving state. This state will momentarily freeze any events to be executed. The events are buffered and executed when the unit finishes the save operation. Due to the limited size of the pre-trigger buffer, the unit will only enter this state when the pre-trigger duration is large, and the recording duration is comparatively small. In most cases, the saving state may not exist or could be unnoticeably small.

The following table illustrates how the processor is operated in the four states and goes from one to another under certain conditions, events, and button clicks from the user:

| Received command | State | | | |
| --- | --- | --- | --- | --- |
| | Idle | Armed | Recording | Saving (Very short period) |
| (No command received) | Idle | Armed | Saving | Armed |
| RUN button | Goes to Armed | None | None | None |
| STOP button | None | Goes to Idle | Goes to Saving, then to Idle | Goes to Idle |

-continued

| Received command | State | | | |
|---|---|---|---|---|
| | Idle | Armed | Recording | Saving (Very short period) |
| Arm for Trigger (software command) | Goes to Armed | None | Goes to Armed after current Recording is complete | Goes to Armed after Saving is completed |
| Start Recording (hard button or software command) | None | Goes to Recording | None | Goes to Recording after Saving is complete |
| Stop Recording (hard button or software command) | None | None | Goes to Saving, then to Armed | Goes to Armed |
| Esc Button | None | None | None | None |

Figure 4:
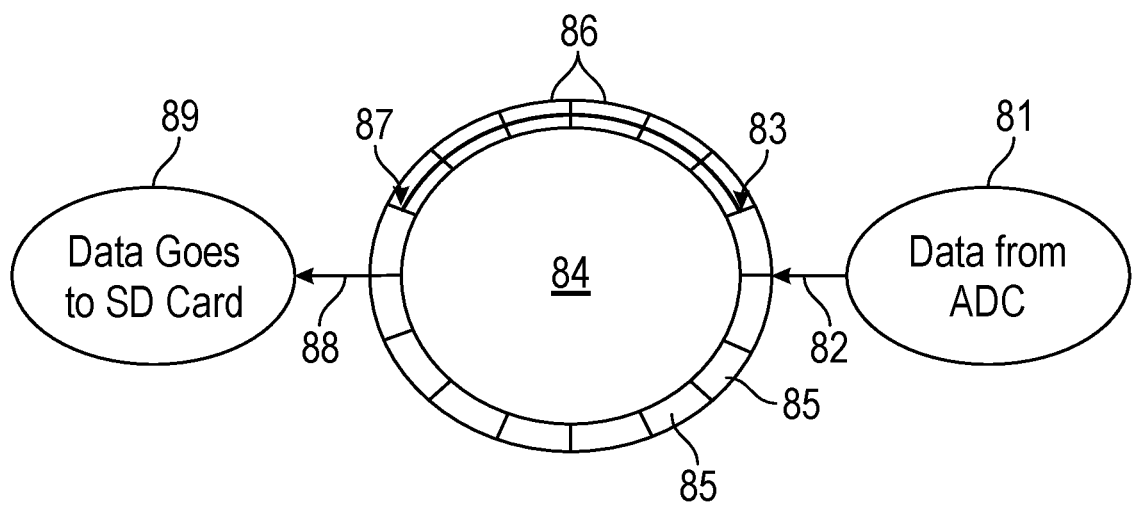
FIG. 4 is a schematic block diagram of a circular buffer structure for the temporary retention of pre-trigger information by the architecture of FIG. 2.

In one relevant case, a trigger event will allow the processor to determine which part of buffered data shall be acquired and saved to memory. This is shown in FIGS. 4 and 5.

Data 82 from one of the unit's analog-to-digital converter (ADC) 81 is continuously transferred to a circular queue 84 with temporary storage locations 85. The write position pointer is indicated by 83 and moves from one location 85 to the next. Whenever a trigger associated with a Start Recording action comes in, the reading pointer 87 is activated from the position of current writing pointer minus the length of pre-trigger. For example, if the pre-trigger has a duration of x seconds, which maps to y points (considering the number of channels, sampling rate and pre-trigger duration), then the reading action will be initiated at the current writing pointer location 83 minus y points. According to the hardware design, the reading speed is always higher than the writing speed even when all channels are recorded at the highest sampling rate. Therefore, the data 88 is always written to the SD card 89 before it is overwritten by the writing pointer 83 to prevent data losses. Data not yet processes in FIFO order is represented by locations 86. After a certain period, the reading pointer 87 will catch up with the writing pointer 83. This means that there is no new data to store. In this case, the processor will wait until the writing pointer's next move and then it will save whatever new data is written into the buffer. When the system receives a Stop Recording command while recording is in progress, the processor will make sure that all the measurement data for the pre-trigger duration and the data till current writing pointer are encrypted and saved to the SD card 89. For example, a user sets the pre-trigger duration as 120 seconds and the post trigger duration as 10 hours. If a Stop Recording command is received 9 hours after the Start Recording command, the system will save all 120 seconds of pre-trigger, plus the 9 hours of post-trigger recording. When no pre-trigger duration is needed or when a Start Recording action is received before the pre-trigger reaches the user set duration, the reading pointer is adjusted accordingly to write the pre-trigger contents to the recording.

Figure 5:
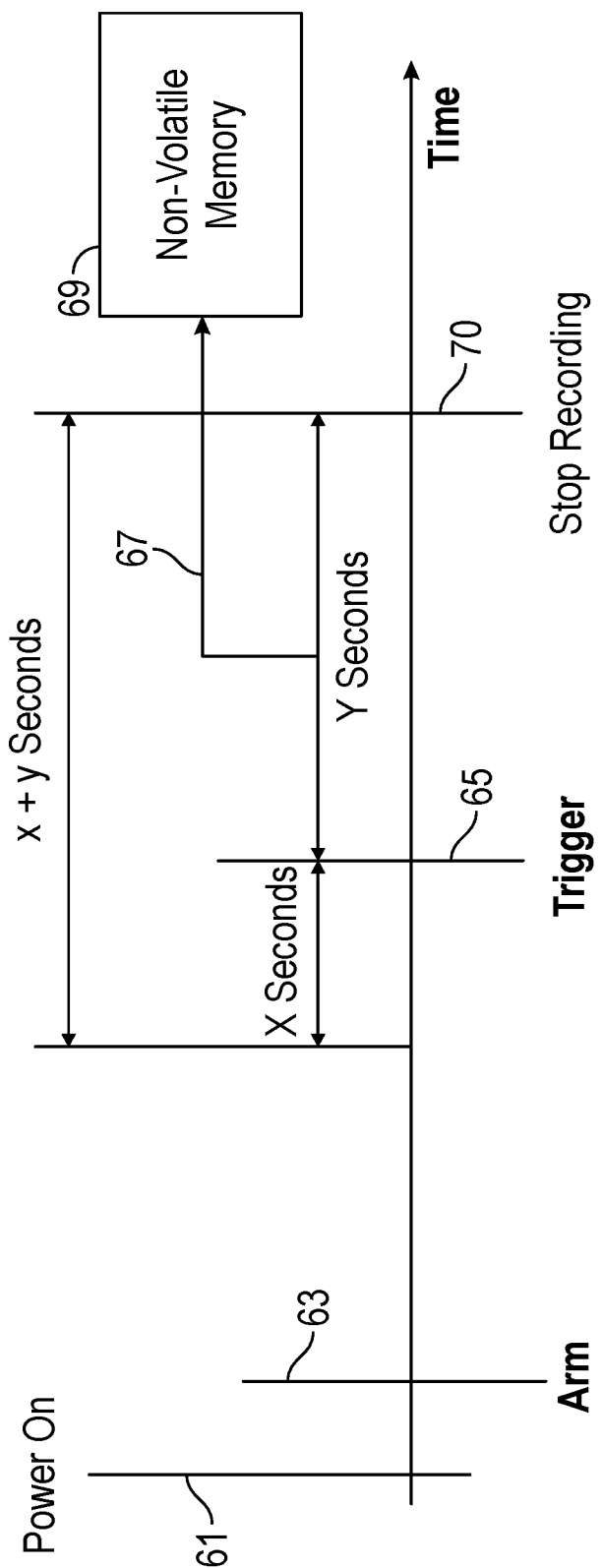
FIG. 5 is a timing diagram illustrating a sequence of events over time before and after a trigger in a data acquisition architecture as in FIG. 2.

As seen in FIG. 5, when the data acquisition unit (DAQ) is powered on full operation mode 61, the trigger unit is armed 63 (a signal threshold level and a post-trigger recording duration are specified) according to a schedule and continuous circular recording of each data stream in a buffer starts. The buffer has a size that allows temporary retention of x seconds of data until overwritten, so that the last x seconds is always available. Whenever a data stream crosses the specified threshold, a trigger event 65 is registered by the trigger unit. The data currently in the buffer (the last x seconds) is transferred 67 into non-volatile memory 69, followed by a continuous data stream for the specified post-trigger recording duration (the next y seconds) that is directly transferred 67 into non-volatile memory 69. After the conclusion of the post-trigger recording duration, a scheduled stop command 70 returns the operation to continuous circular recording in the buffer and the trigger is re-armed for any subsequent trigger events.

A feature of the improved structure is that buffered data that has been received immediately prior to a trigger ('pre-trigger' data) can also be stored. The total recording duration, (x+y), which includes, x, a segment of pre-trigger and y, the duration after trigger, can be as short as milliseconds or as long as days. It really depends on the application. The criterion is that the recording duration must cover the whole range of the transient process of interest. For example, when this method is used to record the sound wave of a gunshot, the duration of recording is probably less than 1 second. When this method is used to record the sound boom of a supersonic aircraft, the duration is about 200 seconds or less. If it is used to record the earthquake, it is usually less than a few minutes.

Figure 6:
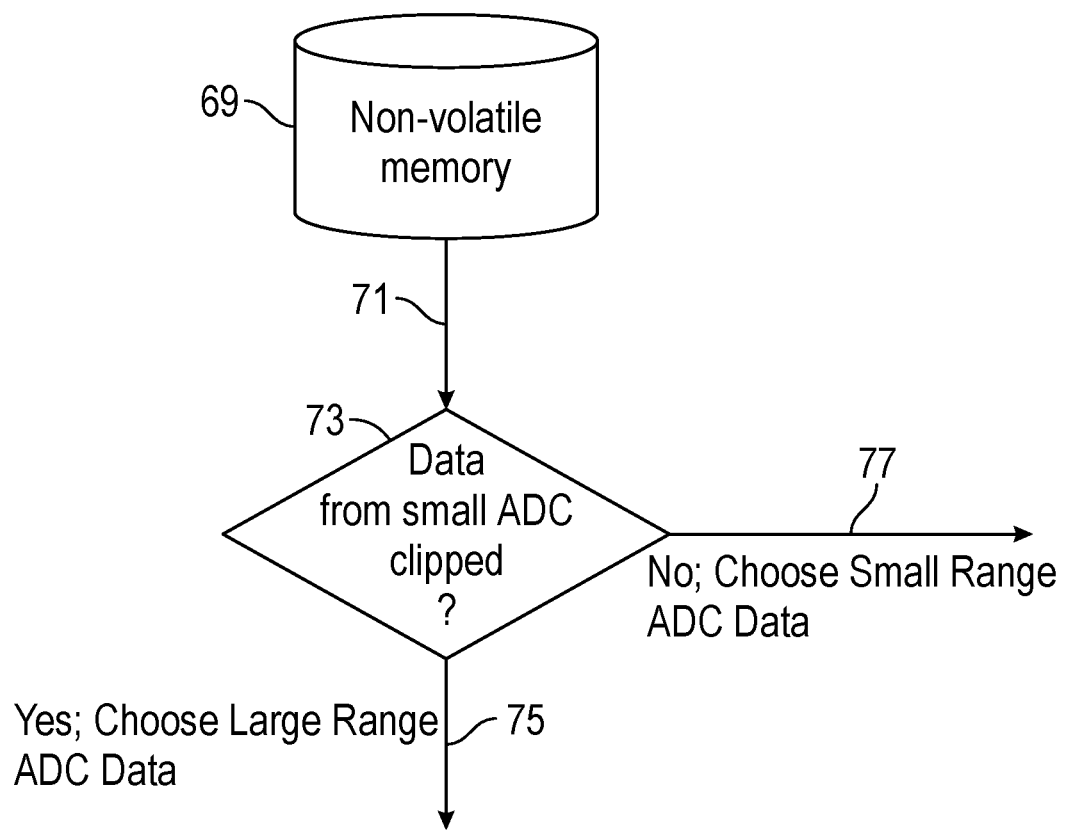
FIG. 6 is a flow diagram showing decision branches for data processing of the saved data streams from the present invention.

After the recording of complete transient process of both channels, the application software will need to determine the signals from which channel to use. Now, as shown in FIG. 6, data 71 recorded from both the small gain (large range) and large gain (small range) pathways are evaluated for each triggered event. The data 71 is read from the nonvolatile memory unit 69. The determination factor in the decision step 73 is that there may be certain points of in the higher-gain ADC pathway that record out of its smaller ADC range, which is called clipping. In that case, the signal from the large-gain, small-range ADC should not be used, while the data from the lower gain, large range ADC should instead be used 75. On the other hand, if the large-gain, smaller range ADC data has never been clipped during the entire recorded duration of a triggered event, then it should always be used 77, instead of those from the large-range ADC, because the data from small-range ADC has much better signal-noise-ratio. Note that the clipping detection and determination 73 of which ADC channel to use, i.e., the large-range ADC data or small-range ADC data, is not made in real time while the data is still being recorded, but rather only after a complete data set of an event to be analyzed has been fully recorded. Only after a review of the entire (x+y) duration of a triggered event, can a decision be made as to which pathway to use. Also, the determination for any given data set is (and need be) only performed once.

The detection can happen on either (or both) channels. Assume we have two input ranges: ±0.1V and ±10V. The smaller range is available on the high gain pathway, while the larger range is available on the low gain pathway. The detection threshold is set to ±0.1V, the smaller of the ranges. If the processor detects a signal that is larger than +0.1V (or smaller than −0.1V), i.e., outside the smaller range, we will determine that it will be clipped in the large-gain, small-range pathway of ±0.1V. The current implementation is that so long as a signal is detected in either of the two paths, it can be determined whether that signal is clipped in the small range pathway.

In a typical data acquisition system, usually there are more than one input channel. The amount of data recorded will be doubled comparing to a conventional system. For a typical 4-input channel DAQ system, total 8 streams of data shall be recorded. But since today's hardware technology is greatly improved comparing with those 15 years ago, the data storage and processing speed are all much better than before. Storing double amount of data is not a concern at all. Note also that sensor hardware is relatively expensive, so the splitting each of 4 sensor channels into two ADC channels of different gain for a total of eight channels is not the same as employing 8 different hardware sensors.

The technique used for the clipping detection is quite simple. It can be set to detect whether the amplitude of the measurement signals (recorded digital data values) ever exceed the hardware ADC range, which is a known level. Either pathway could be used, but in practice to detect if a signal is clipped on the large gain, small range ADC channel, we actually look at the amplitude of data in the small gain, large range ADC channel.

First, the threshold of the clipping limit is defined by the THD (Total Harmonic Distortion) value. THD is a measure to the distortion of the signal path when an ideal sine wave is fed in. This is for testing purpose. A good signal path should have very low THD value. The THD is defined in the following formula:

$$THD_F = \frac{\sqrt{V_2^2 + V_3^2 + V_4^2 + \ldots}}{V_1}$$

where Vn is the RMS value of the nth harmonic voltage and V1 is the RMS value of the fundamental component.

Assume input range of the circuitry design of the small range ADC channel is 500 mV. A good hardware design shall make sure that any signal path on or below 500 mV in this channel will maintain an acceptable THD value, say −80 dB. While THD is measured and verified using a sine wave, a low THD value indicates less distortion to any type of signal input. The smaller the value of THD, the better the signal path. Now when a signal comes into both large and small range ADC channels, each data sample on the large range ADC channel will be checked against ±500 mV. If any sample is outside the designated threshold limit, we will then determine that clipping happens in the small range ADC channel. This clipping detection can happen in the real time before the data is recorded or can be detected as part of post processing algorithm. Regardless, the clipping status is known based on whether total harmonic distortion (THD) exceeds, or does not exceed, some specified threshold level. (A −80 dB threshold level is representative, but some other threshold could also be chosen.)

Figure 7A:
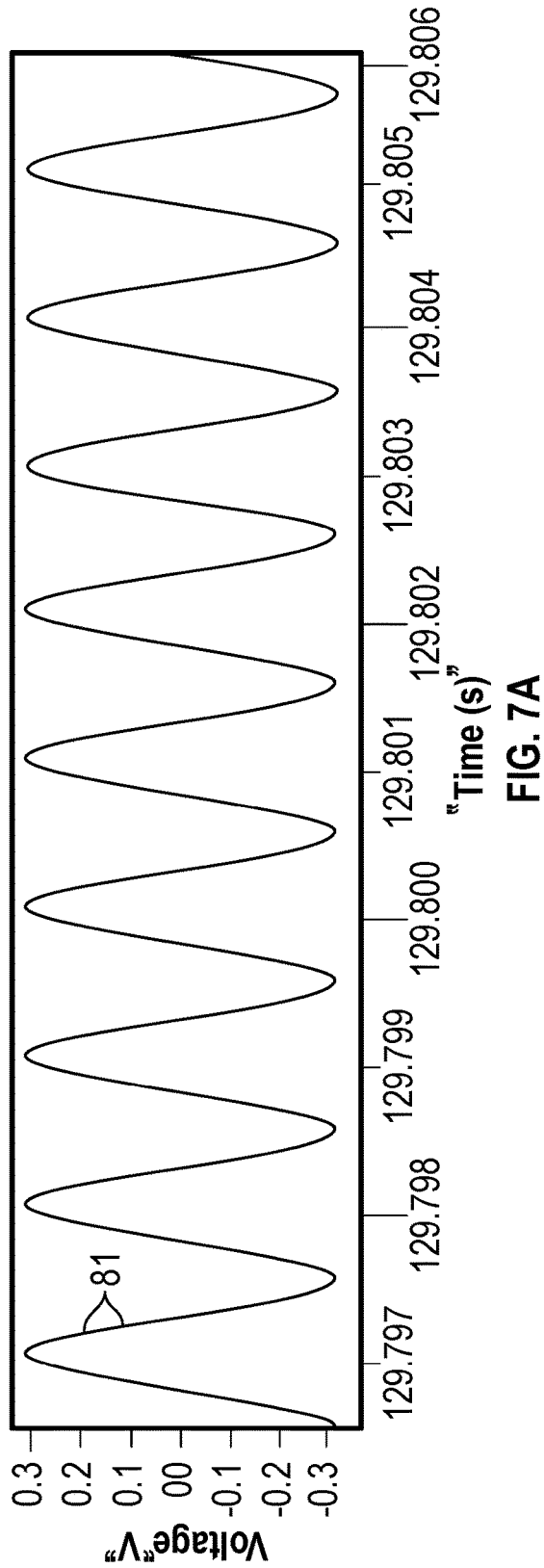
FIGS. 7A and 7B are graphs of amplified sine wave excitation signals respectively without clipping and with clipping of the signal in a large gain (and small range) pathway.

The plot in FIG. 7A shows that signals 81 from both ADC ranges with a typical sine wave as signal source. The two signals overlap so well that we can't tell the differences. But if we analyze the details of the noise, the large range ADC channel may be 20 times noisier than those from the small range ADC signal. Therefore, once recorded and no clipping is detected, the signal from small ADC should be chosen.

Figure 7B:
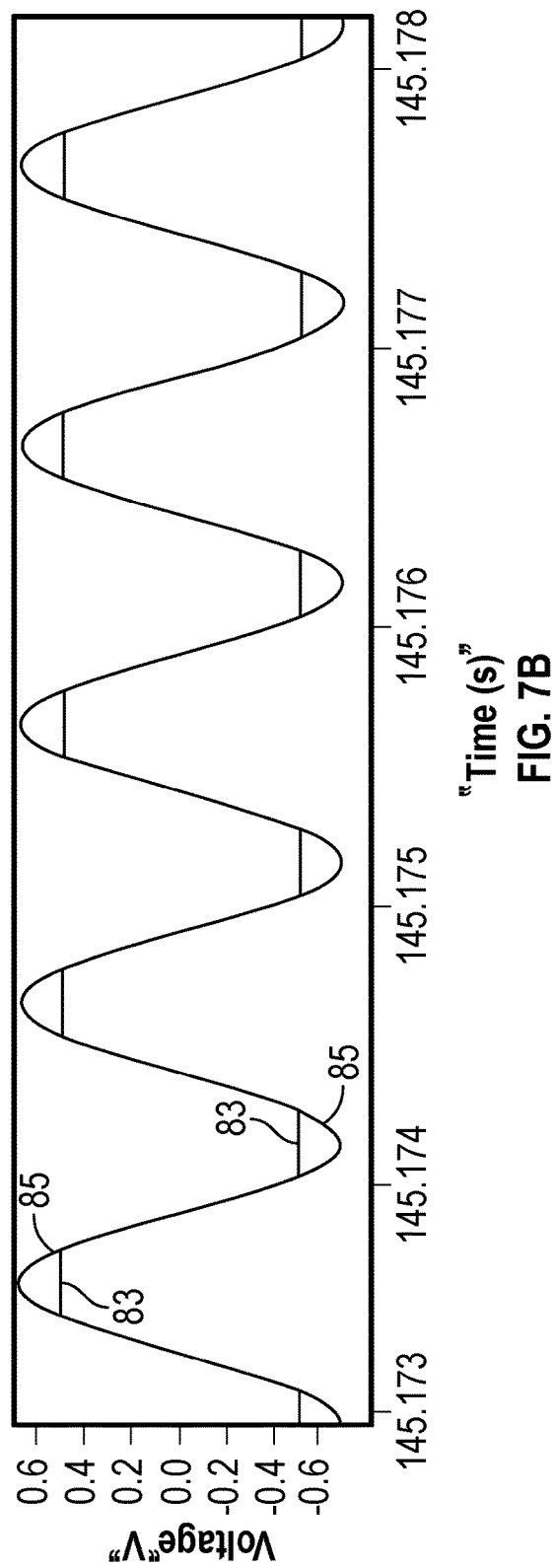

However, the plot in FIG. 7B shows that when the amplitude of sine wave excitation is increased to above 500 mV, the clipping line 83 can be seen in the large gain, small range ADC signal pathway is detected, whereas it continues to be a sine wave 85 in the smaller gain, large range ADC pathway. In this case, the application software should switch to use the signal from the smaller gain, large range ADC pathway.

The invention claimed is:

1. A data acquisition architecture in a measurement system comprising:
   a sensor channel providing an analog measurement input signal;
   a first path connected to receive the analog measurement input signal and having a higher-gain analog amplifier and a smaller-range analog-to-digital converter to provide a first high-gain/small-range digital data stream;
   a second path connected to receive the analog measurement input signal and having a lower-gain analog amplifier and a larger-range analog-to-digital converter to provide a second low-gain/large-range digital data stream; and
   a memory connected to the first and second paths to receive and store both the first high-gain/small-range and the second low-gain/large-range digital data streams,
   wherein the first and second digital data streams are subject to cross-channel calibration between each other and the calibrated data streams are stored in the memory.

2. A data acquisition architecture in a measurement system comprising:
   a sensor channel providing an analog measurement input signal;
   a first path connected to receive the analog measurement input signal and having a higher-gain analog amplifier and a smaller-range analog-to-digital converter to provide a first high-gain/small-range digital data stream;
   a second path connected to receive the analog measurement input signal and having a lower-gain analog amplifier and a larger-range analog-to-digital converter to provide a second low-gain/large-range digital data stream; and
   a memory connected to the first and second paths to receive and store both the first high-gain/small-range and the second low-gain/large-range digital data streams,
   further comprising for each data stream:
      a circular data buffer to temporarily store the most recent measurement data of a specified period;
      a trigger mechanism operative to transfer both pre-trigger measurement data from the circular data buffer and a specified subsequent period of the data stream to the memory.

3. The data acquisition architecture as in claim 2, wherein the trigger mechanism is responsive to a data amplitude in one of the data streams exceeding a specified threshold amplitude.

4. The data acquisition architecture as in claim 2, wherein the first and second digital data streams are subject to cross-channel calibration between each other and one of the calibrated data streams is monitored by the trigger mechanism for crossing of a threshold amplitude to trigger storage in the memory.

5. The data acquisition architecture as in claim 2, wherein the trigger mechanism is responsive to a digital input signal event.

6. A measurement system, comprising:
   at least one sensor channel providing an analog measurement input signal;
   for each sensor channel, a first path connected to receive the analog measurement input signal and having a higher-gain analog amplifier and a smaller-range analog-to-digital converter to provide a first high-gain/small-range digital data stream, and a second path connected to receive the analog measurement input signal and having a lower-gain analog amplifier and a larger-range analog-to-digital converter to provide a second low-gain/large-range digital data stream;

a memory connected to the first and second paths to receive and store both the first high-gain/small-range and the second low-gain/large-range digital data streams from each sensor channel; and a processor enabled, for each sensor channel and for each sensor event stored in the memory, to:

(a) determine a presence or absence of clipping of the first higher-gain/smaller-range digital data stream; and (b) select the stored first higher-gain/smaller-range digital data stream for analysis if no clipping is detected, but select the stored second lower-gain/larger-range digital data stream for analysis if clipping of the stored first higher-gain/smaller-range digital data stream is detected.

7. The measurement system as in claim 6, wherein there are at least four sensor channels, each providing for storage in the memory of different pairs of data stream amplitude ranges.

8. The measurement system as in claim 6, wherein, for each sensor channel, the first and second digital data streams are subject to cross-channel calibration between each other and the calibrated data streams are stored in the memory.

9. The measurement system as in claim 6, further comprising for each data stream:

a circular data buffer to temporarily store the most recent measurement data of a specified period;

a trigger mechanism operative to transfer both pre-trigger measurement data from the circular data buffer and a specified subsequent period of the data stream to the memory.

10. The measurement system as in claim 9, wherein the trigger mechanism is responsive to a data amplitude in one of the data streams exceeding a specified threshold amplitude.

11. The measurement system as in claim 9, wherein the first and second digital data streams are subject to cross-channel calibration between each other and one of the calibrated data streams is monitored by the trigger mechanism for crossing of a threshold amplitude to trigger storage in the memory.

12. The measurement system as in claim 9, wherein the trigger mechanism is responsive to a digital input signal event.

13. The measurement system as in claim 6, wherein, for each sensor channel, the relative gains of the respective amplifiers in the first and second paths differ at least 10-fold, and corresponding ranges of the respective digital data streams in the second and first paths also differ at least 10-fold.

14. The measurement system as in claim 6, wherein the presence of any clipping is detected using the stored smaller-gain/larger-range data stream and calculation of total harmonic distortion in that data stream.

15. The measurement system as in claim 14, wherein a threshold level of total harmonic distortion is used as an indicator of the presence of clipping.

16. The measurement system as in claim 6, wherein the presence of any clipping is detected by a comparison of calibrated data from both data streams and a detection of amplitude differs between those data streams indicating saturation in the lower range data stream.

* * * * *